(12) United States Patent
Bazan et al.

(10) Patent No.: US 6,999,222 B2
(45) Date of Patent: Feb. 14, 2006

(54) PLASMON ASSISTED ENHANCEMENT OF ORGANIC OPTOELECTRONIC DEVICES

(75) Inventors: Guillermo C. Bazan, Santa Barbara, CA (US); Jacek Ostrowski, Santa Barbara, CA (US); Alexander Mikhailovsky, Ventura, CA (US); Monica Katiyar, Kanpur (IN)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/639,867

(22) Filed: Aug. 13, 2003

(65) Prior Publication Data

US 2005/0035346 A1 Feb. 17, 2005

(51) Int. Cl.
*H01L 35/24* (2006.01)
*G02F 1/03* (2006.01)

(52) U.S. Cl. .................................... 359/248; 359/254
(58) Field of Classification Search ................ 359/248, 359/249, 250, 251, 254; 313/504; 315/169.3; 250/483.1, 487.1, 368
See application file for complete search history.

(56) References Cited

U.S. PATENT DOCUMENTS 4,649,280 A * 3/1987 Holland et al. .......... 250/483.1

OTHER PUBLICATIONS

Raether, H., "Surface plasmons on smooth and rough surfaces and on gratings." *Springer tracts in modern physics*, vol. 111, Springer-Verlag, Berlin, Heidelberg, New York, 1988.

Snoeks, E. et al., "Measuring and Modifying the Spontaneous Emission rate of Erbium near an Interface." *Physical Review Letters*, 74(13):2459-2462 (1995).
Vo-Dinh, T., "Surface-enhanced Raman spectroscopy using metallic nanostructures." *Trends in analytical chemistry*, 17(8+9):557-582 (1998).
Weissberger, A. et al., "Physical Methods in Chemistry, Part III." *Wiley Interscience* New York, 1972.
Weitz, D.A. et al., "The enhancement of Raman scattering, resonance Raman scattering, and fluorescence from molecules adsorbed on a rough silver surface." *The Journal of Chemical Physics*, 78(9):5324-5338 (1983).
Amos, R.M. et al., "Modification of the spontaneous emission rate of Eu3+ ions close to a think metal mirror." *The American Physical Society*, 55(11):7249-7254 (1997).
Brust, M. et al., "Synthesis of thio-derivatized gold nanoparticles in a 2-phase liquid-liquid system." *R.J. Chem. Soc., Chem. Commun.*, 801 (1994).

(Continued)

*Primary Examiner*—Scott J. Sugarman
*Assistant Examiner*—Richard Hanig
(74) *Attorney, Agent, or Firm*—Fulbright & Jaworski

(57) ABSTRACT

Optoelectronic devices and methods for their fabrication having enhanced and controllable rates of the radiative relaxation of triplet light emitters are provided exemplified by organic light emitting devices based on phosphorescent materials with enhanced emission properties. Acceleration of the radiative processes is achieved by the interaction of the light emitting species with surface plasmon resonances in the vicinity of metal surfaces. Non-radiative Förster-type processes are efficiently suppressed by introducing a transparent dielectric or molecular layer between the metal surface and the chromophore. For materials with low emission oscillator strengths (such as triplet emitters), the optimal separation distance from the metal surface is determined, thus suppressing energy transfer and achieving a significant acceleration of the emission rate.

66 Claims, 7 Drawing Sheets

OTHER PUBLICATIONS

Chew, H., "Transition rates of atoms near spherical surfaces." *The Journal of Chemical Physics*, 87(2):1355-1360 ((1987).

Förster, T., "Intermolecular energy migration and fluorescence." *Ann. Phys.* 2, 55 (1948).

Gersten, J. et al., "Spectroscopic properties of molecules interacting with small dielectric parties." *J. Chem. Phys.* 75(3), 1139 (1981).

Gong, X. et al., "High-Efficiency Polymer-Based Electrophosphorescent Devices." *Advanced Materials*, 14 (8):581-585 (2002).

Gryczynski, I. et al., "Multiphoton Excitation of Fluorescence near Metallic Particles: Enhanced and Localized Excitation." *The Journal of Chemical Physics*, 106: 2191-2195 (2002).

He, L. et al., "Colloidal Au-Enhanced Surface Plasmon Resonance for Ultrasensitive Detection of DNA Hybridization." *The Journal of Chemical Physics*, 122:9071-9077 (2000).

Lakowicz, J.R., "Radiative Decay Engineering: Biophysical and Biomedical Applications," *Analytical Biochemistry*, 298:1-24 (2001).

Liz-Marzan, L.M. et al., "Synthesis of Nanosized Gold-Silica Core-Shell Particles." *Langmuir* 12:4329-4335 (1996).

Lue, J.T. et al., "Surface plasmon enhanced optical second harmonic generation in ultra-thin metallic films." *J. Nonlinear Opt. Phys.* 4, 503 (1999).

Patel, N.K. et al., "High-Efficiency Organic Light-Emitting Diodes." *IEEE Journal on Selected Topics in Quantum Electronics*, 8(2):346-361 (2002).

Philpott, M.R., "Effect of surface plasmons on transitions in molecules." *The Journal of Chemical Physics*, 62(5):1812-1817 (1975).

* cited by examiner

Core/shell         Organic capping

PLASMON ASSISTED ENHANCEMENT OF ORGANIC OPTOELECTRONIC DEVICES

FIELD OF THE INVENTION

The present invention is in the field of organic optoelectronic devices, particularly electroluminescent organic light emitting diodes.

BACKGROUND OF THE INVENTION

The basic structure of an organic light emitting diode (OLED) consists of a stack of thin layers of organic material sandwiched between a transparent anode and a metallic cathode. The organic material layers comprise a hole-injection layer, a hole-transport layer, an emissive layer, and an electron-transport layer. When an appropriate voltage (typically between 2 and 30 volts) is applied to the device, the injected charge excites the chromophores to produce light (electroluminescence) by the radiative recombination of injected positive and negative charges in the emissive layer. The structure of the organic layers and the anode and cathode are chosen to maximize the radiative recombination process in the emissive layer, thus maximizing the light output from the OLED device. Similar devices are polymer light emitting diodes (PLEDs). An alternative source of energy to excite the chromophores is a light source, such as a laser generating optical pulses at a wavelength and intensity sufficient to cause the light emitter layer to emit light, generally in the range of 150 nm to 2000 nm.

Chromophore, lumophore, fluorophore, light emitting material are synonyms for compounds emitting radiation with optical frequencies upon their excitation from external energy sources. Radiative recombination (radiative decay, radiative relaxation) refers to the direct transition of a chromophore from excited to ground state accompanied by emission of a light quantum (photon).

Triplet emitters, i.e., phosphorescent materials with low oscillator strength of transition responsible for the emission of luminescence caused by the triplet nature of the excited state, are useful materials in such photonic applications. Indeed, the triplet nature of the emitting state ensures that in light emitting devices, such as OLEDs or PLEDs, the 25% efficiency limit predicted previously for singlet emitters does not exist [Patel et al.]. However, such materials typically exhibit small oscillator strengths of the radiative transition and very long emission life-times (up to several seconds). This leads to low luminescence yields due to competition with faster non-radiative processes. Also, slow radiative recombination limits the performance of LEDs due saturation of lumophores and non-radiative processes such as triplet-triplet quenching, at high rates of carriers injection.

Thus, it is would be very useful to be able to accelerate the radiative recombination processes in triplet emitters while keeping other optical properties unchanged. Routes for the radiative decay manipulation are found in the formula for the Einstein coefficient $A_{21}$, governing the spontaneous emission of two-level system [Snoeks et al.]; see equation 1:

$$A = \pi\omega|D|^2\rho(r,\omega)/\hbar \in (r) = k_{rad} \quad (1)$$

where $\omega$ is an emission photon cyclic frequency, D—matrix element of transition dipole, $\in$—dielectric constant of surrounding medium, and $\rho$ is a local density of states (LDOS) for the electromagnetic field. As seen from equation (1), the rate of radiative decay can be manipulated by means of variation of LDOS and/or dielectric constant of environment. The latter parameter varies only slightly in optically transparent materials suitable for LED applications, allowing very little control over $k_{rad}$. In contrast, variation of LDOS could be very large if the light emitting material is placed in a specially designed environment [Lakowicz; Philpott et al.; Weitz et al.].

It is known from previous reports, that LDOS can be increased in the vicinity of metal structures supporting surface plasmons [Lakowicz]. Surface plasmons (surface plasmon polaritons) are collective two dimensional oscillations of electron density. To achieve optimal performance from the chromophore, one has to balance several dynamical processes. First, the radiative decay can be accelerated in the vicinity of metal surfaces, due to modification of the local density of states from the electromagnetic field of the surface metal [Weitz et al.]. Second, one can expect an increase of the absorption cross-section of the material because of the incident field enhancement by the surface plasmon [Lakowicz; Weitz et al.; Raether]. Third, the chromophore's interactions with metal surfaces can introduce additional non-radiative losses caused by Förster-type energy transfer between the emitter and a metal [Lakowicz; Weissberger et al.]. The latter process leads to quenching of light emission, and could significantly degrade the luminescence yield. This non-radiative channel of the energy relaxation can be eliminated if the separation between the light emitting species and the metal surface is large enough. The rate of dipole-dipole Förster energy transfer follows the $1/r^6$ law [Förster]. Spatial decay of the transfer rate depends on the system geometry, for bulk metals it could be $1/r^3$ and for large metal particles $\sim 1/r^4$. See equation 2:

$$k_F = \frac{1}{r^6} \frac{1}{\tau_{rad}} \int A_D(\lambda) I_A(\lambda) d\lambda \quad (2)$$

where r is the distance between the chromophore and the metal surface, $A_D(\lambda)$ and $I_A(\lambda)$ are absorption and emission spectra of the metal and chromophore, respectively, and $\lambda$ is the wavelength. It follows from equation (2) that the Förster energy transfer mechanism is efficient only within a limited volume around acceptor species (i.e. metal in our case). It is possible to introduce a spacer with a critical length $L_c$, such that at distances larger than $L_c$ energy transfer process is negligibly small. Thus, one could achieve a net enhancement of the lumophores emissive properties if the enhancement (Enhancement=$k_{rad}/k_{rad}^0$—, $k_{rad}^0$ is the radiative decay rate of isolated molecule) is non-zero at distances larger than $L_c$. See FIG. 1 which shows the typical distance-dependence for the Förster-type emission quenching rate for triplet (dashed curve) and singlet (dotted curve) emitting chromophores in the vicinity of a metal particle (Au 20 nm diameter). Circles correspond to the distance-dependence of emission rate enhancement calculated for the same conditions using the Mie scattering approach [Chew]. For triplet emitting chromophores with life-times of about 1 microsecond, the net enhancement is observed if chromophore/metal separation is larger than $L_c$. For singlet emitting chromophores, with high oscillator strength, efficient energy transfer makes the enhancement difficult.

Thus far, there are no reports on radiative decay control in triplet emitters based on interactions with surface plasmons. Several theoretical papers consider issues of the radiative life-time modification in the vicinity of metal planar surfaces [Raether] and nanoparticles [Weitz et al.; Chew]. The Förster-type emission quenching has been studied in several papers (see, e.g. [He et al.]) but primarily as a separate process. Several attempts have been made to alter the decay rate in singlet emitters [Lakowicz], but were inconclusive since acceleration of the excited state decay in this case could be attributed to fast quenching processes. The latter may be very efficient for singlet chromophores because of their large transition moment and short intrinsic radiative lifetime (see equation (2)). Surface plasmon-light interactions are covered in numerous journal papers, books, and reviews (e.g. [Raether]) mostly in conjunction with optical surface enhanced phenomena, such as Raman scattering [Vo-Dinh], second harmonic generation [Lue et al.], two-photon absorption [Gryczynski et al.], etc. There are no reports on surface plasmon-enhancement of organic triplet emitter-based LEDs.

SUMMARY OF THE INVENTION

The present invention provides, inter alia, the surface plasmon-enhancement of organic triplet emitter-based LEDs. It provides optoelectronic devices having enhanced and controllable rates of the radiative relaxation of triplet light emitters, exemplified by organic light emitting devices based on phosphorescent materials with enhanced emission properties. It achieves acceleration of the radiative processes by the interaction of the light emitting species with surface plasmon resonances in the vicinity of metal surfaces. It efficiently suppresses non-radiative Förster-type processes by introducing a transparent dielectric or molecular layer between the metal surface and the chromophore. For materials with low emission oscillator strengths (such as triplet emitters), the optimal separation distance from the metal surface is determined, thus suppressing energy transfer and achieving a significant acceleration of the emission rate.

By practicing the present invention the radiative decay of triplet emitters can be accelerated using interaction with surface plasmons in metal nanostructures and surfaces. Interaction between the surface plasmon and the light emitting species is achieved by bringing them into close proximity and providing a mechanism for their efficient interaction. Coupling of surface plasmon to the light emitting molecules can be performed either using special coupling devices (diffraction grating, near-field coupler, etc.), or without the special devices, if this is allowed by the system's geometrical configuration (e.g., by using metal nanoparticles).

In order to accelerate the radiative recombination rate of long-living chromophores while preserving their emissive properties, the metal surface and the light emitting species are separated spatially. This prevents emission quenching by Förster-type energy transfer from the fluorophore to the metal. It is possible to determine a critical distance between metal structure supporting surface plasmons and the light emitting molecule. At distances larger than the critical distance but within the plasmon coupling range, the excited state decay of chromophore occurs mostly through radiative channels with a net emission rate higher than that of an isolated molecule. At distances shorter than critical distance, light emission is diminished due to energy transfer processes which destroy the excited states. The critical distance depends on metal nanostructure size, shape, and composition, and is directly proportional to the fluorophore's emissive oscillator strength.

The aforementioned separation of the light emitting material and metal surfaces can be provided by use of dielectric layers (e.g. silica capping) or surface capping by organic molecules. In order to achieve significant enhancement of the radiative decay rate, the chromophore's emission band and the surface plasmon resonance spectral energies are set to specific values which can be determined using both classical (classical scattering theory [Chew]) and quantum mechanical (Local density of states formalism [Gersten]) approaches.

The surface plasmon-assisted radiative decay acceleration is possible both for electrical and optical excitation of fluorescence and phosphorescence. Other techniques for generation of chromophore's excited states are also possible. The present invention enables one to increase the emission quantum yield of the chromophore and to create light emitting devices with improved current conversion efficiency, enhanced brightness, and higher saturation current densities. The increase of light emitting device efficiency is attributed to enhanced emission yield, decreased emission saturation threshold, and local field enhancement effects.

Details of surface plasmon-enhanced light emitting device designs are varied, but they require that the light emitting material be situated in the close vicinity to the structure supporting the surface plasmon. This requirement can be achieved by mixing the chromophore and metal nanostructures inside the matrix, depositing chromophores on top of fabricated metal nanostructure, or a coupling device. The surface plasmon-supporting structures could be a part of a light emitting device's light emitting layer, or be incorporated into the electrode, or charge transfer layers. The metal structure supporting the surface plasmon can be surrounded by a protective dielectric layer preventing non-radiative energy transfer processes.

The foregoing technology can be used for the radiative decay engineering in high oscillator strength chromophores ("singlet emitters") if the Förster transfer critical distance is small in comparison with the radiative decay enhancement radius.

DETAILED DESCRIPTION OF THE INVENTION

Figure 1:
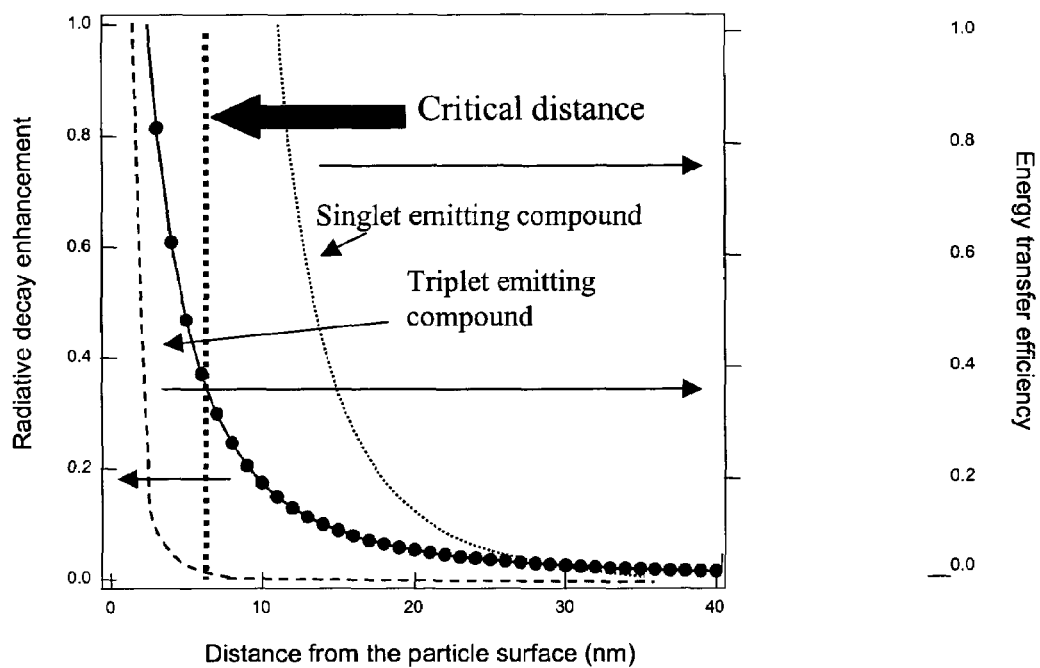
FIG. 1 shows the typical distance-dependence for the Förster-type emission quenching rate for triplet (dashed curve) and singlet (dotted curve) emitting chromophores in the vicinity of a metal particle (Au 20 nm diameter)
Figure 2:
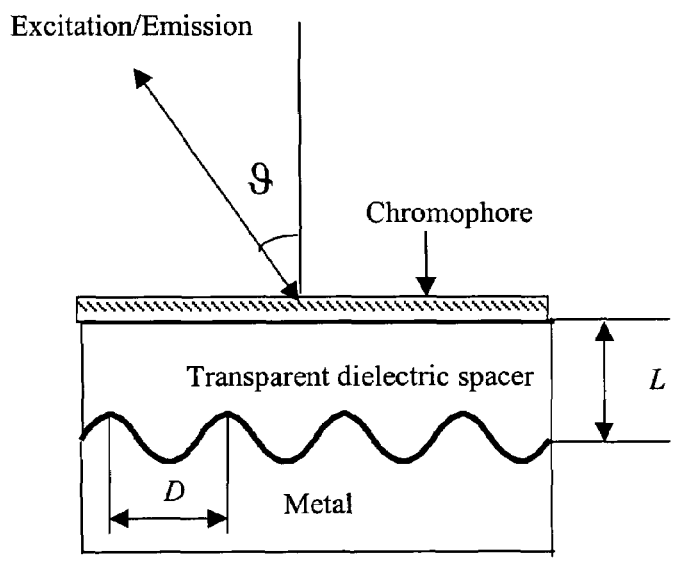
FIG. 2 is a schematic depiction of the general configuration of a planar metal structure with a periodic modulation and dielectric spacer layer separating metal surface and chromophore.

Surface plasmon-assisted acceleration of the radiative processes can be achieved if plasmon modes are strongly coupled to propagating modes of electromagnetic waves. In the case of a true two dimensional (planar) metal surfaces, surface plasmons do not interact directly with light [Raether]. This obstacle can be overcome by use of special coupling devices created on metal surfaces, such as periodic corrugation or diffraction grating. FIG. 2 depicts the general configuration of a planar metal structure with a periodic modulation and dielectric spacer layer separating metal surface and chromophore. Bragg-like diffraction law determines the wavelength and direction for surface plasmon-assisted radiation; see equation 3:

$$\frac{2\pi}{\lambda}\varepsilon_2^{1/2}\sin\vartheta \pm m\frac{2\pi}{D} = k'_x \quad (3)$$

where $\varepsilon_2$ is the dielectric constant of medium surrounding metals surface, D—period of surface modulation, m—integer number, $k'_x$—real part of surface plasmon wavevector's lateral component, and $\Theta$ is an angle between the light emission direction and normal to the surface.

As seen from equation (3), the surface plasmon-enhanced emission from the light emitting material has a pronounced directional maxima of emission intensity. For a specific chromophore, the period of the grating coupler can be tailored so that equation (3) is satisfied for m=1 at wavelengths corresponding to the maximum of emission spectrum and small angles, $\Theta$. This will allow for the maximum enhancement of emission to be directed close to normal to the metal surface and use the largest spatial harmonic of the periodic structure.

Metals exhibiting strong surface plasmon resonances in the visible or infrared range of spectrum (such as Ag, Au, Cu, Pt, Pd, and Os) can be used as a material for the periodically corrugated metal structures. To avoid non-radiative losses and a reduction in luminescence yield, the metal surface can be over coated with a layer of a transparent dielectric material in the emission range of the chromophore. It should also exhibit sufficient adhesion to metal surface. Optimal thickness of the dielectric spacer layer varies depending on the oscillator strength of light emitting species and metal used. Typically, it is in the range of 5–150 nm.

The chromophore can be any triplet emitter compound with an emission spectrum satisfying equation 3 for a given grating period and direction of enhanced emission. Examples of suitable triplet emitters are: iridium complexes, lanthanide complexes, organic triplet emitters, porphyrins, and osmium complexes. Use of singlet emitters is possible, although, they might require a thicker spacer and the overall radiative rate enhancement might be less pronounced, compared to a triplet emitting chromophore. As a result of a larger spatial separation between the metal and the chromophore may be needed. Examples of suitable singlet emitters are: organic dyes, conjugated polymers conjugated oligomers and quantum confined semiconductor particles. Light emitting materials can be deposited directly on top of the spacer layer as a free-standing film or embedded into an appropriate matrix. Examples of suitable light emitting materials are: iridium complexes, lanthanide complexes, organic triplet emitters, porphyrins, osmium complexes, organic dyes, conjugated polymers, conjugated oligomers and quantum confined semiconductor particles. The thickness of the chromophore layer should be small in comparison with thickness of the dielectric spacer, as shown schematically in FIG. 2 (not to scale).

The radiative decay of a chromophore in this planar structure is affected by two major mechanisms depending on the separation of light emitting species and the metal surface. The first one is related to interactions with the surface plasmon, and the second one is attributed to a simple interference between light waves reflected by the metal surface [Weissberger et al.] (Also known as an "image charge" effect). The latter effect can lead to acceleration of radiative decay as well as a deceleration of radiative decay, though it is typically small in comparison with surface plasmon-related acceleration of emission. It is possible to adjust the thickness of the dielectric layer in order to achieve optimal acceleration of radiative recombination via both interference and surface plasmon-based mechanisms.

Chromophores can reach their excited states by optical excitation, electrical current, or by any other suitable means. In the case of optical excitation of emissive species, an increase of emission intensity can be achieved if the wavelength and direction of the excitation beam satisfy equation 3 due to direct excitation of surface plasmons and large enhancement of local field intensity.

Quantitative evaluation of the aforementioned devices performance can be performed by means of radiative lifetime measurements, photo- and electroluminescence yield measurements, and studies of emission angular dependence.

Planar Metal Structures

EXAMPLE 1

Figure 3:
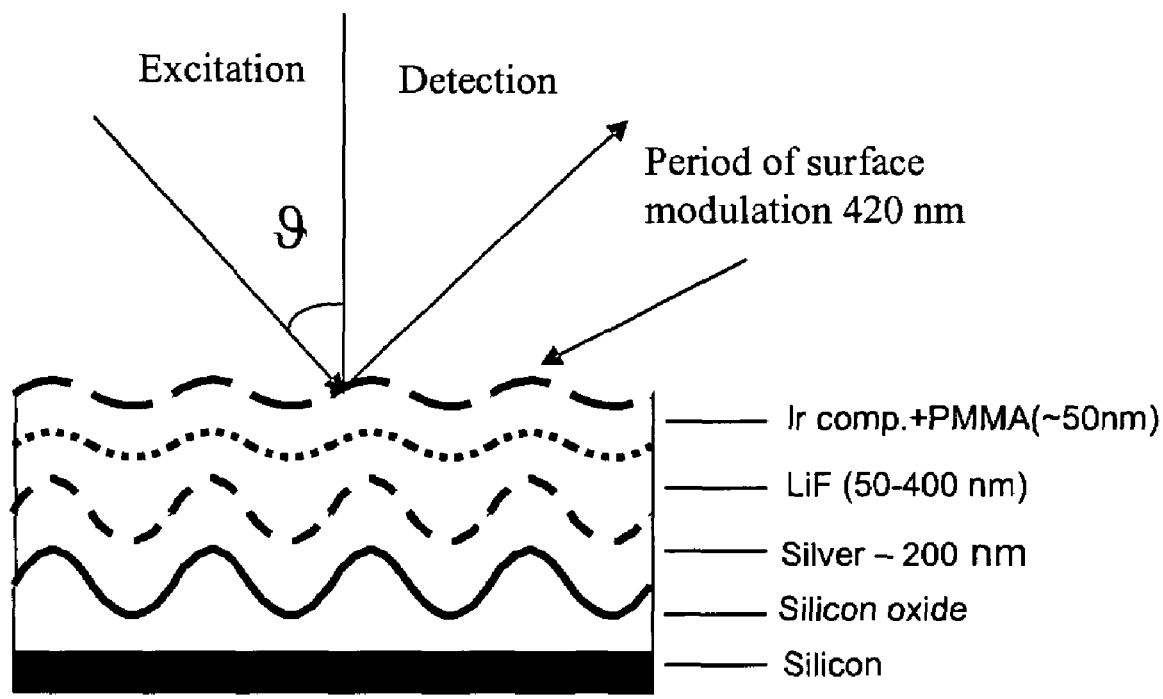
FIG. 3 is a schematic depiction of a planar metal structure with periodic modulation and dielectric spacer layer separating a metal surface and chromophore.

FIG. 3 depicts a planar metal structure with periodic modulation and dielectric spacer layer separating a metal surface and chromophore. It shows the layout of a planar periodic structure designed and constructed to demonstrate surface plasmon-assisted acceleration of radiative processes in triplet chromophores. The structure comprises a silver grating coated with a lithium fluoride, LiF, layer of variable thickness and a layer of iridium triplet emitter on top. The substrate was made by oxidizing a silicon wafer and then introducing a holographic grating with a 440 nm periodic structure and an amplitude of 70 nm, by photolithographic means. On this grating, a 200 nm sliver film was formed by e-beam deposition techniques. To avoid oxidation of the silver surface, substrates were placed under a nitrogen atmosphere before e-beam deposition of LiF films. The LiF thickness varied between 2–400 nm to change the average distance between the chromophores and the silver surface and to find the optimal configuration of the device.

The prototype phosphor used to study the effect of surface plasmons on the radiative life-time is tris[9,9-dihexyl-2-(pyridinyl-2')fluorene] iridium (III), since OLEDs made of this material can have external quantum efficiency close to 10% [Gong et al.]. We dispersed 4 wt % of the tris[9,9-dihexyl-2-(pyridinyl-2')fluorene] iridium (III) in poly(methylmethacrylate)-2%-co-ethylacrylate and spun the films from a 1% solution (1 mg in 1 mL) at 3000 RPM for 60 sec. The spun films are approximately 50 nm thick.

Emission decay was measured using a photomultiplier tube connected to a digital oscilloscope. For excitation of the chromophore, optical pulses generated by a YAG:Nd laser or a Ti:Sapphire regenerative amplifier were converted into the ultraviolet range of the spectrum using an optical harmonic generation process. Thus excitation photon wavelengths of 354 nm (YAG:Nd) and 400 nm (Ti:Sapphire) were employed.

Figure 4:
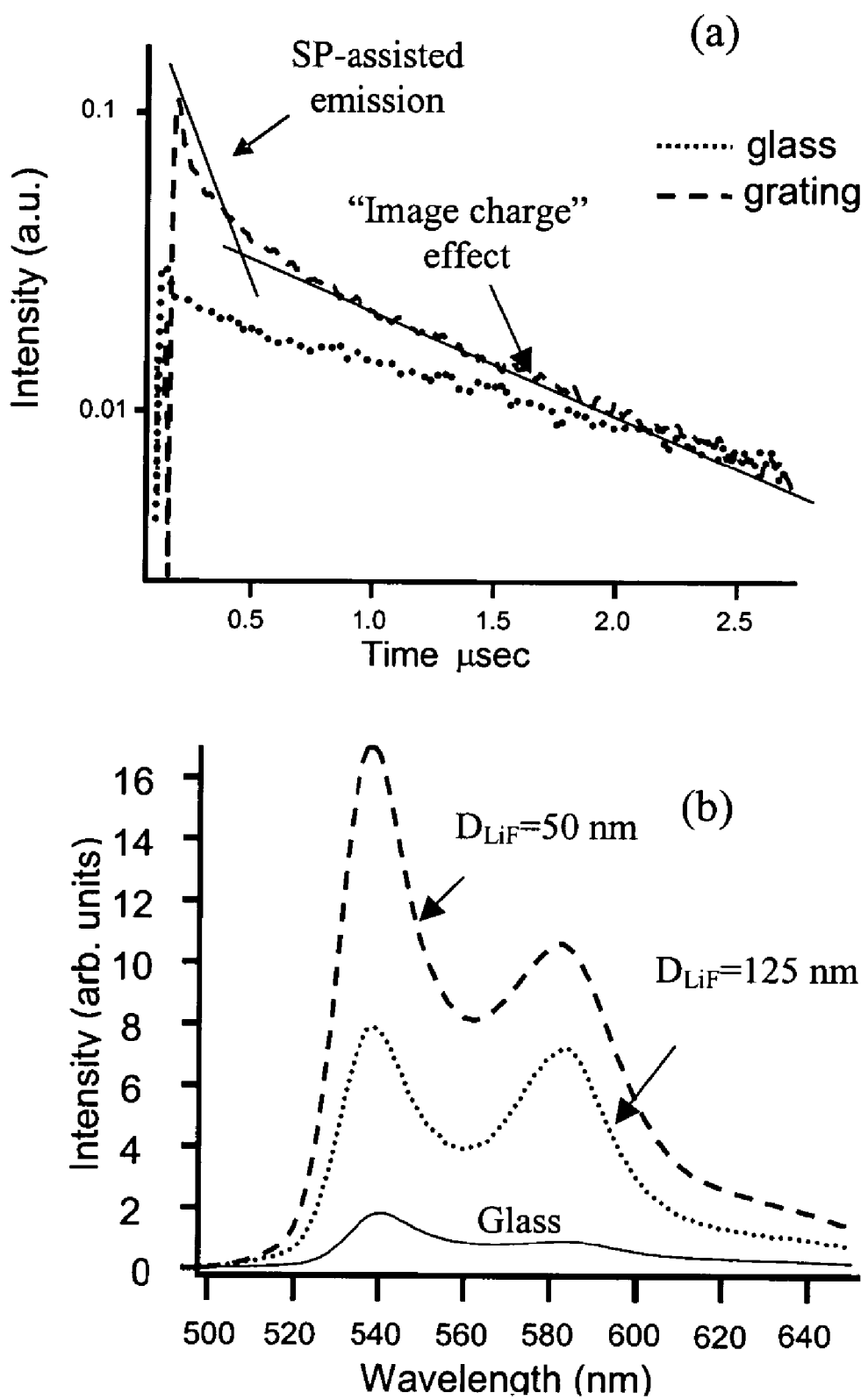
FIG. 4(a) shows the emission decay of tris[9,9-dihexyl-2-(pyridinyl-2')fluorene] iridium (III) on a dielectric substrate (glass) and on the periodically modulated metal/dielectric structure of FIG. 3.
FIG. 4(b) shows the intensity of fluorescence emission under identical excitation conditions as in FIG. 4(a) on a dielectric glass (solid line) and on the periodically modulated metal/dielectric structure of FIG. 3 with a thickness of 50 nm (dashed line) and 125 nm (dotted line) for the dielectric spacer.
Figure 5:
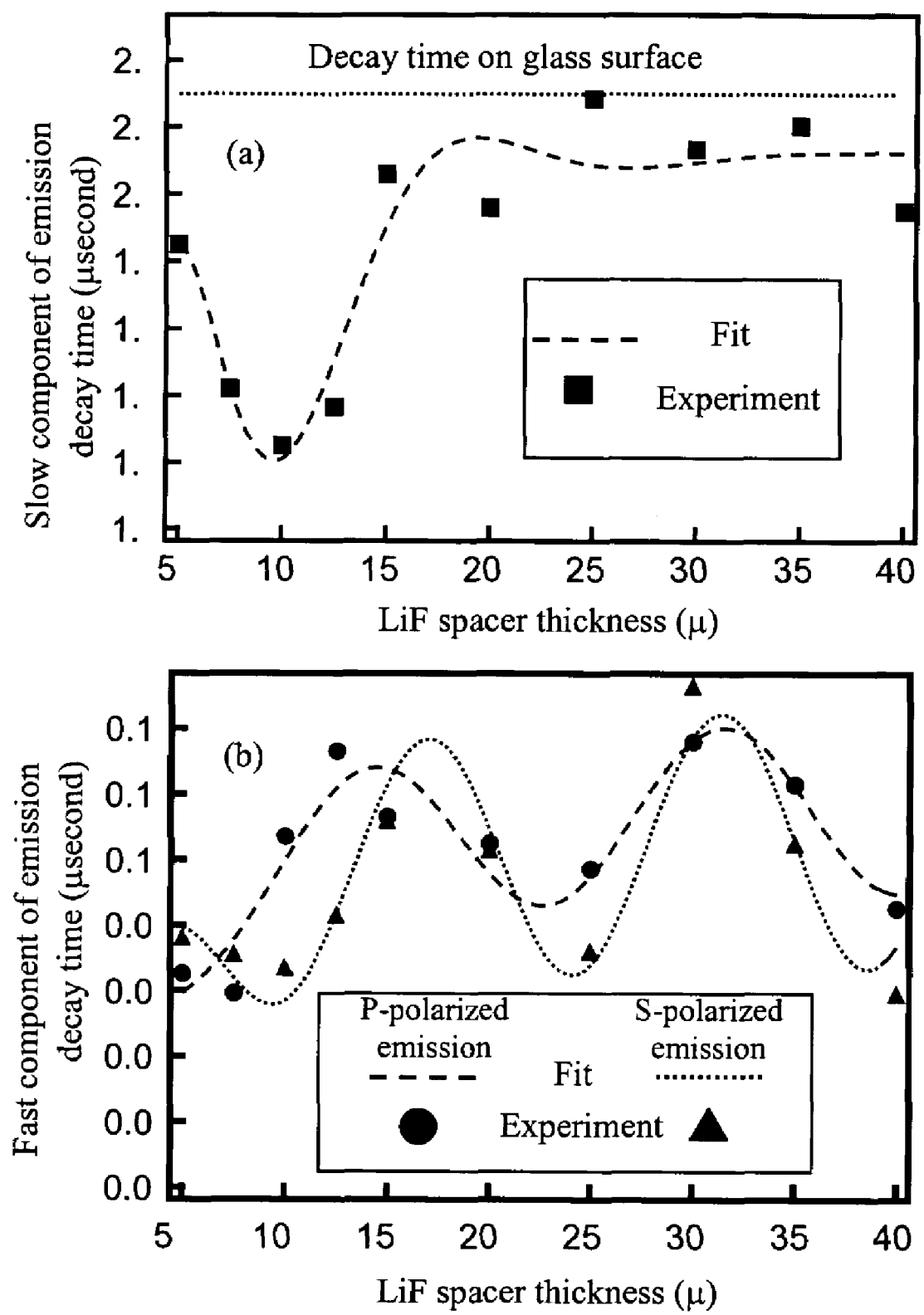
FIG. 5 shows the distance dependence of (a) slow and (b) fast emission decay components on the periodically modulated metal/dielectric structure of FIG. 3.

A significant acceleration of the radiative decay has been observed in these periodic structures compared with chromophores deposited on plain glass substrates. FIG. 4(a) shows the emission decay of the tris[9,9-dihexyl-2-(pyridinyl-2')fluorene] iridium (III) on the glass dielectric substrate and on the periodically modulated metal/dielectric structure of FIG. 3. Two mechanisms were identified that lead to the modification of the radiative recombination rate. The first originates from interference between the light emitted by the chromophore and the light reflected by metal surface (sometimes it is referred to as "image charge" effect [Weissberger et al.; Amos et al.]). This phenomenon leads to modification of the radiative recombination rate and depends periodically on thickness of the dielectric spacer. In this experiment, this effect results in the variation of a slow component of emission decay, as seen in FIG. 5, which shows the distance dependence of (a) slow and (b) fast emission decay components on the periodically modulated metal/dielectric structure of FIG. 3.

The fast component in photoluminescence transients was attributed to surface plasmon-assisted emission of photons. This effect is not observed in samples deposited on pure dielectric substrates (e.g., glass). The decrease in triplet lifetime cannot be attributed to emission quenching due to Förster-type energy transfer because the spacer thickness is large enough to suppress this process completely. The amplitude of the fast surface plasmon-related component of emission decay also exhibits periodic dependence on the dielectric layer thickness.

Though quantitative measurements of emission yield were not possible for these samples, relative intensities of emission were compared for samples with the triplet emitting chromophore deposited on glass surface and on periodic structures supporting surface plasmons. FIG. 4(b) shows the intensity of fluorescence emission under identical excitation conditions as in FIG. 4(a) on a dielectric glass (solid line) and on the periodically modulated metal/dielectric structure of FIG. 3 with a thickness of 50 nm (dashed line) and 125 nm (dotted line) for the dielectric spacer. It shows that the emission on periodically structures exhibits a significant increase of intensity, which is attributed to surface plasmon-assisted emission.

The example demonstrates, in FIG. 4(b), that the radiative recombination rate of triplet emitting chromophores can be accelerated using interactions with the surface plasmon, and this acceleration can be very efficient. Indeed, from the integrated decay curves shown in FIG. 4(a), one can find that, at the delay time of 1 microsecond after excitation, 56% of the excited chromophores have already relaxed to ground state emitting a photon in the plasmon assisted configuration. While samples deposited on glass when measured at the same time delay as above, only showed 34% of the excited molecules have emitted a photon.

Non-Planar Metal Structures

In systems with non-planar symmetries, the surface plasmon-light coupling device is not necessary since surface plasmons can interact with electromagnetic radiation directly [Raether]. In this case, an enhancement of the luminescence rate can be observed by simply placing chromophores in the vicinity of a metal structure exhibiting surface plasmons.

The aforementioned metal structures can be prepared in the form of nanoparticles of different sizes and shapes, their aggregates, ordered and disordered structures, and arrays with 1-, 2-, or 3-dimensionality. As with planar metal structures, metals exhibiting strong surface plasmon resonances in the visible or infrared range of the spectrum (such as Ag, Au, Cu, Pt, Pd, and Os) can be used as a material for the preparation of those nanoparticles. The size of the nanoparticles can be varied in the range of several nanometers to several hundred nanometers and should be chosen by the specific requirements of the application. Generally, sub-10 nm nanoparticles and nanoparticles with a characteristic size close to wavelength of the emitted light demonstrate only moderate enhancement.

The position of surface plasmon resonance in metal nanoparticles can be tuned by variation of the particle size and shape. In non-spherical particles, multiple surface plasmon resonances corresponding to transverse and longitudinal modes of electronic density oscillations can be observed and used in radiative decay control applications. Spectral and spatial distributions of the emission rate enhancement can be found using classical scattering theories (e.g., Mie's approach [Chew]) or quantum mechanics formalism (LDOS calculations) [Gersten]. Typically, the radiative decay enhancement band is red-shifted with respect to exact surface plasmon.

Figure 6:
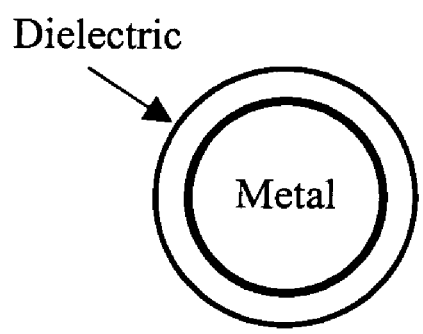
FIG. 6 is a schematic depiction of nanoparticle-based surface plasmon-supporting structures with a dielectric or molecular spacer layer.
Figure 6:
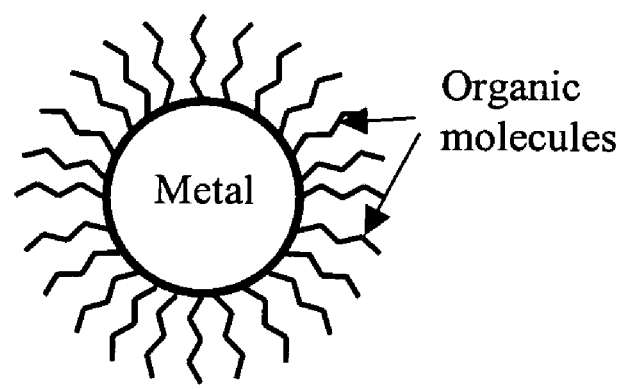

To avoid Förster-type emission quenching, the aforementioned particles can be over coated with a layer of organic capping molecules or a solid shell of a transparent dielectric. FIG. 6 schematically depicts nanoparticle-based surface plasmon-supporting structures with a dielectric or molecular spacer layer. Examples of suitable shell materials are: $SiO_2$, $TiO_2$, $Al_2O_3$, BaF, LiF, and $CaF_2$. Examples of suitable organic capping molecules are: polymers, alkylthiols, alkylamines, alkanes, surfactants, lipids, proteins, DNA, and alkylphoshates. The critical thickness for the protective capping layer is dependent on the emitter oscillator strength and follows the $f^{1/6}$ law (f—radiative transition oscillator strength). Comparing the distance-dependences for emission quenching and enhancement, one can determine the optimal thickness of the dielectric separation layer.

The chromophore can be any triplet emitting compound with an emission spectrum overlapping the emission enhancement band. Examples of suitable triplet emitting compounds are: iridium complexes, lanthanide complexes, organic triplet emitters, porphyrins, and osmium complexes. Use of singlet emitters is also possible, though they may require a thicker spacer and the overall radiative rate enhancement might be less significant. Examples of suitable singlet emitters are: organic dyes, conjugated polymers conjugated oligomers and quantum confined semiconductor particles.

Figure 7:
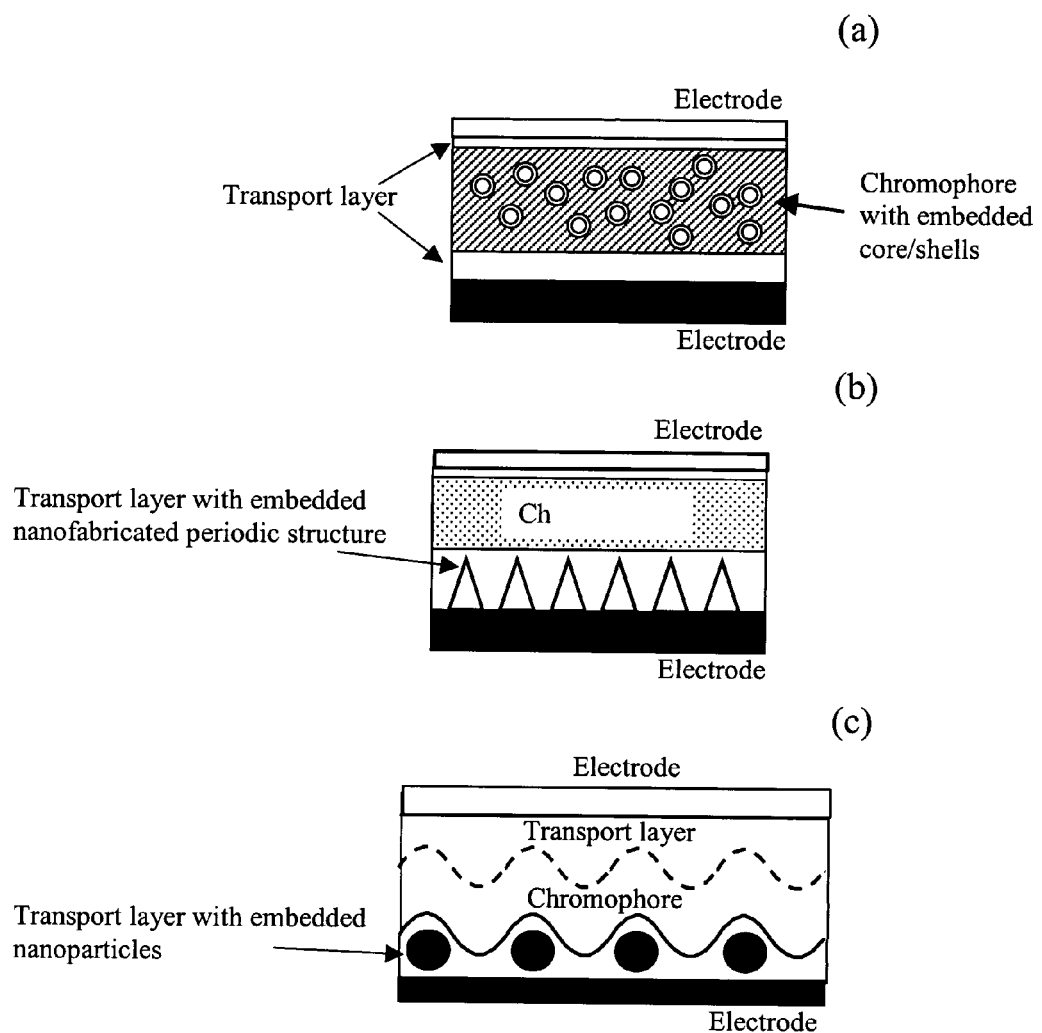
FIG. 7 are schematic depictions of surface plasmon-enhanced LED structures: (a) metal/dielectric (core/shells) embedded into the emissive layer, (b) periodic nanofabricated structure embedded into the transport layer, and (c) nanoparticles embedded into the transport layer.

Surface plasmon-enhanced LED structures constructed in accordance with embodiments of the invention are schematically shown in FIG. 7: (a) metal/dielectric (core/shells) embedded into the emissive layer, (b) periodic nanofabricated structure embedded into the transport layer, and (c) nanoparticles embedded into the transport layer. Core/shell nanoparticles [Liz-Marzán et al.] can be embedded directly into a matrix containing the chromophore (FIG. 7(a)), or can be deposited in a separate layer (such as a hole or electron transport layer in a LED); See FIG. 7(b,c)). In the latter case, maintaining proper separation between metal particles and light emitting material is necessary for optimum device performance. A proper separation depends on the transition oscillator strength of the chromophore and is typically from about 1 nm to about 300 nm. Deposition of nanoparticles in a periodic structure can further increase the emission rate and lead to the formation of directional emission pattern governed by equation 3.

The chromophore's excited state can be generated by optical excitation, charge carrier injection or by any other suitable means.

Quantitative performance evaluation of the aforementioned devices can be obtained by means of radiative lifetime measurements, photo- and electroluminescence yield measurements, and studies of the emission's angular dependence.

EXAMPLE 2

In this example, gold colloidal nanoparticles were embedded in OLEDs in order to enhance device efficiency and increase the saturation threshold of triplet emitters under a large charge injection rate.

Au nanoparticles were synthesized according to Brust et al. $HAuCl_4$ in $H_2O$ (15 mL) was added into a reaction vessel. To this tetra octyl ammonium bromide (TOABr) in 40 mL toluene was added and stirred for 20 minutes. Dodecylthiol was added subsequently to serve as a capping agent and to provide a spacer layer of organic molecules around the nanoparticle's core and prevent non-radiative emission quenching. After an additional 20 minutes of stirring, $NaBH_4$ was added, the reaction mixture turned black, and this was stirred for an additional 1.5 hours. The aqueous phase was removed and the organic phase was washed with 1M $H_2SO_4$, concentrated sodium bicarbonate, and dried with sodium sulfate. The particles were precipitated with methanol, MeOH, and the suspension was centrifuged to collect the solid material. The particles can be washed with MeOH or can be further purified by soxhelet extraction to remove excess TOABr. A plasmon extinction peak was observed around 550 nm in polymer matrices and was spectrally close to the emission band of iridium compounds used in OLED fabrication. In polymer/nanoparticles blends, we observed acceleration of the emission processes while maintaining high fluorescence yields.

Figure 8:
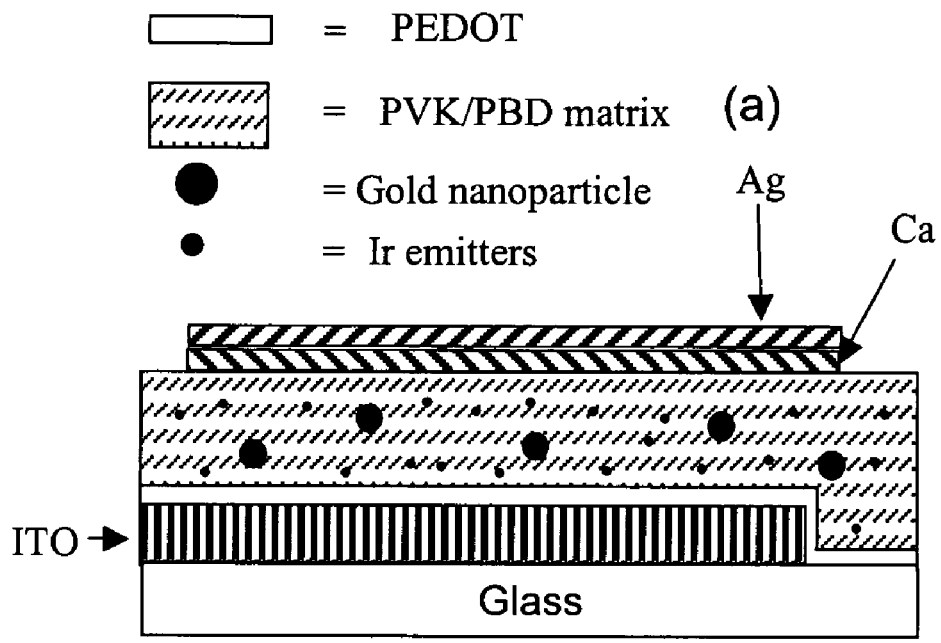
FIG. 8(a) is a schematic depiction of a LED structure fabricated for the demonstration of surface plasmon enhancement of LED performance.
FIG. 8(b) shows LED emission brightness/voltage curves for different concentration of Au particles in tris(2,5-bis-2'-(9',9'-dihexylfluorene)pyridine)iridium (III)/polyvinyl carbazole (PVK)/2-(4-bipheny)-5-(4-tertbutylphenyl)-1,3,4-oxadiazole (PBD)/blend.

To demonstrate increase of radiative decay rate and surface plasmon enhancement of OLED performance, we prepared the test structure shown in FIG. 8(a). A LED structure was fabricated and deposited on a glass substrate partially covered with indium tin oxide (ITO). The ITO layer was coated first by a 20 nm thick Baytron P film and then with a 100 nm thick mixture of 56% polyvinyl carbazole (PVK)/ 36% 2-(4-bipheny)-5-(4-tertbutylphenyl)-1,3,4-oxadiazole (PBD)/4% dodecylthiol capped nanoparticles (8 nm average diameter)/4% tris(2,5-bis-2'-(9',9'-dihexylfluorene)pyridine) iridium (III). A top electrode was built by deposition of 1000 Å of calcium and 1000 Å of silver. This layer provides charge injection and an electrical contact to an external source.

The device performance, with varying concentrations of dodecylthiol-capped gold nanoparticles by weight to the iridium chromophore, was studied using standard LED characterization techniques. The results of these measurements are in FIG. 8(b) which shows LED emission brightness/voltage curves for different concentration of Au particles in tris(2,5-bis-2'-(9',9'-dihexylfluorene)pyridine) iridium (III)/polyvinyl carbazole (PVK)/2-(4-bipheny)-5-(4-tertbutylphenyl)-1,3,4-oxadiazole (PBD)/blend. The 0% trace corresponds to a mixture without gold nanoparticles. It exhibits a maximum brightness of 500 $cd/m^2$. At low bias voltages, OLEDs containing nanoparticles exhibit similar performance. But at bias voltages between 9–12 V, they demonstrate almost a twofold increase of brightness when compared with film blends with no gold. The maximum increase of brightness has been observed at relative Au particles/iridium complexes weight concentrations of about 0.25–0.5%. At higher concentration of gold nanoparticles, device efficiency decreased, most likely due to emission quenching at poorly capped nanoparticles surface.

The enhanced performance of devices with nanoparticles can not be attributed to increases in charge injection rate since the current density was identical in both doped and undoped structures under the same driving voltage. The addition of gold nanoparticles with surface plasmons spectrally overlapping the chromophores emission band leads to increase of the radiative decay rate and electroluminescence quantum yield.

Although the present invention and its advantages have been described in detail, it should be understood that various changes, substitutions and alterations can be made herein without departing from the spirit and scope of the invention. Moreover, the scope of the present application is not intended to be limited to the particular embodiments of the devices, structures, methods and steps described in the specification. As one of ordinary skill in the art will readily appreciate from the disclosure of the present invention, devices, structures, methods or steps presently existing or later to be developed that perform substantially the same function or achieve substantially the same result as the corresponding embodiments described herein may be utilized according to the present invention. Accordingly, the appended claims are intended to include within their scope such devices, structures, methods or steps.

REFERENCES

The following references are all incorporated herein by reference.

Amos, R. M., and W. L. Barnes, "Modification of spontaneous emission rates of $Eu^{3+}$ ions close to a thin metal mirror", Phys. Rev. B 55, 7249 (1997).

Brust, M., M. Walker, D. Bethell, D. J. Shiffrin, and R. Whyman, "Synthesis of thiol-derivatized gold nanoparticles in a 2-phase liquid-liquid system", R. J. Chem. Soc., Chem. Commun., 801 (1994).

Chew, H. "Transition rates of atoms near spherical surfaces", J. Chem. Phys. 87(2), 1355 (1987).

Förster, T., "Intermolecular energy migration and fluorescence", Ann. Phys. 2, 55 (1948).

Gersten, J., Nitzan A., Spectroscopic properties of molecules interacting with small dielectric particles. J. Chem. Phys. 75(3), 1139 (1981).

Gong, X., M. R. Robinson, J. C. Ostrowski, D. Moses, G. C. Bazan, and A. J. Heeger, "High-efficiency polymer-based electrophosphorescent devices", Adv. Mater. 14(8), 581 (2002).

Gryczynski, I., Malicka, J., Shen, Y., Gryczynski, Z., Lakowicz, J. R., "Multiphoton excitation of fluorescence near metallic particles: enhanced and localized excitation", J. Phys. Chem. B 106, 2191 (2002).

He, L., Musick, M. D., Nicewarner, S. R., Salinas, F. G., Benkovic, S. J., Natan, M. J., Keating, C. D., "Colloidal Au-enhanced surface plasmon resonance for ultrasensitive detection of DNA hybridization", *J. Am. Chem. Soc.* 122, 9071 (2000).

Lakowicz, J. R., "Radiative Decay Engineering: Biophysical and Biomedical Applications", *Anal. Biochem.* 298, 1 (2001).

Liz-Marzán, L. M., M. Giersig, P. Mulvaney, "Synthesis of Nanosized Gold-Silica Core-Shell Particles", *Langmuir*, 12, 4329 (1996).

Lue, J. T., Chang C. S., "Surface plasmon enhanced optical second harmonic generation in ultra-thin metallic films", *J. Nonlinear Opt. Phys.* 4, 503 (1999).

Patel, N. K., S. Cinà, and J. H. Burroughes, "High-efficiency organic light-emitting diodes", *IEEE J. Sel. Top. Quant. Elect.* 8(2), 346 (2002).

Philpott, M. R., "Effect of surface plasmons on transitions in molecules", *J. Chem. Phys.* 62(5), 1812 (1975).

Raether, H., *Surface plasmons on smooth and rough surfaces and on gratings*, Springer tracts in modern physics, Vol. 111, Springer-Verlag, Berlin, Heidelberg, N.Y., 1988.

Snoeks, E. A. Lagendijk, and A. Polman, "Measuring and Modifying the Spontaneous Emission Rate of Erbium near an Interface", *Phys. Rev. Lett.* 74, 2459 (1995).

Vo-Dinh, T., "Surface-enhanced Raman spectroscopy using metallic nanostructures", *Trends Anal. Chem.* 17, 557 (1998).

Weissberger, A., B. W. Rossiter, (Eds.), *Physical Methods of Chemistry*, Part III, Wiley Interscience, New York, 1972.

Weitz, D. A., Garoff, S., Gersten J. I., Nitzan, A., "The enhancement of Raman scattering, resonance Raman scattering, and fluorescence from molecules absorbed on a rough silver surface", *J. Chem. Phys.* 78, 5324 (1983).

What is claimed is:

1. An organic optoelectronic device, comprising:
an organic light emitter material;
a metal structure exhibiting strong surface plasmon resonance having a surface in the vicinity of the light emitter material; and
a source of energy for exciting the light emitter material whereby to cause the light emitter material to emit light.

2. The device of claim 1 wherein the metal exhibits strong surface plasmon resonance in the visible or infrared range of the spectrum.

3. The device of claim 1 wherein source of energy comprises charge injection from electrodes disposed to apply an electrical potential across the light emitter material and metal.

4. The device of claim 3 wherein one of said electrodes is a transparent electrode.

5. The device of claim 1 wherein source of energy comprises a light source.

6. The device of claim 5 wherein the light source is a laser generating optical pulses at a wavelength and intensity sufficient to cause the light emitter material to emit light.

7. The device of claim 6 wherein the wavelength is in the range of 150 nm to 2000 nm.

8. The device of claim 1 comprising a transparent dielectric or molecular layer between the metal surface and the light emitting material that suppresses non-radiative Förster-type energy transfer whereby to accelerate the emission rate of the emitter material.

9. The device of claim 1 wherein the organic light emitter material comprises a triplet emitter material.

10. The device of claim 9 wherein the metal exhibiting strong surface plasmon resonance is spatially separated from the triplet emitter material a distance sufficient to suppress non-radiative Förster-type energy transfer whereby to accelerate the emission rate of the triplet emitter material.

11. The device of claim 10 wherein the metal exhibiting strong surface plasmon resonance is spatially separated from the triplet emitter material by a dielectric spacer having a thickness of between 2 and 400 nm.

12. The device of claim 1 wherein the metal exhibiting strong surface plasmon resonance comprises a planar metal structure.

13. The device of claim 12 wherein the planar metal structure is a periodic nanofabricated structure.

14. The device of claim 13 wherein the planar metal structure is a grating.

15. The device of claim 12 including a transparent dielectric spacer separating the surface of the metal structure from the organic light emitter material.

16. The device of claim 15 wherein the thickness of the organic light emitter material is small in comparison with the thickness of the dielectric spacer.

17. The device of claim 16 wherein the thickness of the dielectric spacer is about 2–400 nm.

18. The device of claim 16 wherein the dielectric spacer is LiF.

19. The device of claim 1 wherein the metal exhibiting strong surface plasmon resonance comprises a metal nanostructure.

20. The device of claim 19 wherein the nanostructure is incorporated into the organic light emitter material.

21. The device of claim 19 wherein the source of energy comprises electrodes disposed to apply an electrical potential across the light emitter material and metal and wherein the nanostructure is incorporated into one of said electrodes.

22. The device of claim 19 wherein the nanostructure comprises nanoparticles.

23. The device of claim 22 wherein the nanoparticles are embedded in the light emitting material.

24. The device of claim 1 wherein the organic optoelectronic device comprises a hole-injection layer, a hole-transport layer, said light emissive material, and an electron-transport layer.

25. The device of claim 24 wherein the metal exhibiting strong surface plasmon resonance comprises a periodic nanofabricated structure embedded in the transport layer.

26. The device of claim 24 wherein the metal exhibiting strong surface plasmon resonance comprises nanoparticles embedded in the transport layer.

27. The device of claim 22 wherein each nanoparticle is encased in a shell material.

28. The device of claim 27 in which the shell material is selected from the group consisting of $SiO_2$, $TiO_2$, $Al_2O_3$, $BaF$, $LiF$, and $CaF_2$.

29. The device of claim 22 wherein each nanoparticle is encased in organic capping molecules.

30. The device of claim 29 in which the organic capping molecules are selected from the group consisting of polymers, alkylthiols, alkylamines, alkanes, surfactants, lipids, proteins, DNA, and alkylphosphates.

31. An organic optoelectronic device, comprising:
a hole-injection layer;
a hole-transport layer;
an organic triplet light emitter material;
an electron-transport layer;
a nanofabricated metal structure exhibiting strong surface plasmon resonance in the visible range of the spectrum having a surface in the vicinity of the light emitter material;
a transparent dielectric spacer, having a thickness of between 2 and 400 nm, between the metal surface and the triplet emitter material to suppress non-radiative Förster-type energy transfer whereby to accelerate the emission rate of the emitter material; and transparent and reflecting electrodes disposed on opposite sides of the light emitter material and metal to apply an electrical potential across there whereby to cause the light emitter material to emit light.

32. The device of claim 31 wherein the nanofabricated metal structure comprises a grating.

33. The device of claim 31 wherein the nanofabricated metal structure comprises nanoparticles encased in a shell material or in organic capping molecules and embedded in the triplet emitter material.

34. A method for fabricating an organic optoelectronic device, comprising:

providing an organic light emitter material and a source of energy for exciting the light emitter material sufficiently to cause the light emitter material to emit light; and disposing the surface of a metal exhibiting strong surface plasmon resonance in the vicinity of the light emitter material.

35. The method of claim 34 wherein the metal exhibits strong surface plasmon resonance in the visible and infrared range of the spectrum.

36. The method of claim 34 wherein source of energy comprises charge injection from electrodes disposed to apply an electrical potential across the light emitter material and metal.

37. The method of claim 34 wherein one of said electrodes is a transparent electrode.

38. The method of claim 34 wherein source of energy comprises a light source.

39. The method of claim 38 wherein the light source is a laser generating optical pulses at a wavelength and intensity sufficient to cause the light emitter material to emit light.

40. The method of claim 39 wherein the wavelength is in the range of 150 nm to 2000 nm.

41. The method of claim 34 comprising disposing a transparent dielectric or molecular layer between the metal surface and the light emitter material that suppresses non-radiative Förster-type energy transfer whereby to accelerate the emission rate of the emitter material.

42. The method of claim 34 wherein the organic light emitter material comprises triplet emitter material.

43. The method of claim 42 comprising spatially separating the metal exhibiting strong surface plasmon resonance from the triplet emitter material a distance sufficient to suppress non-radiative Förster-type energy transfer whereby to accelerate the emission rate of the triplet emitter material.

44. The method of claim 43 comprising spatially separating the metal exhibiting strong surface plasmon resonance from the triplet emitter material by disposing a dielectric spacer having a thickness of between 2 and 400 nm between the triplet emitter and the metal surface.

45. The method of claim 34 wherein the metal exhibiting strong surface plasmon resonance comprises a planar metal structure.

46. The method of claim 45 wherein the planar metal structure is a periodic nanofabricated structure.

47. The method of claim 46 wherein the planar metal structure is a grating.

48. The method of claim 45 including disposing a transparent dielectric spacer between the surface of the metal structure from the organic light emitter material.

49. The method of claim 48 wherein the thickness of the organic light emitter material is small in comparison with the thickness of the dielectric spacer.

50. The method of claim 49 wherein the thickness of the dielectric spacer is about 2–400 nm.

51. The method of claim 48 wherein the dielectric spacer is LiF.

52. The method of claim 34 wherein the metal exhibiting strong surface plasmon resonance comprises a metal nanostructure.

53. The method of claim 52 comprising incorporating the nanostructure into the organic light emitter material.

54. The method of claim 52 wherein the source of energy comprises electrodes disposed to apply an electrical potential across the light emitter material and metal and wherein the nanostructure is incorporated into one of said electrodes.

55. The method of claim 52 wherein the nanostructure comprises nanoparticles.

56. The method of claim 55 wherein the nanoparticles are embedded in the light emitter material.

57. The method of claim 34 comprising disposing a hole-injection layer, a hole-transport layer, and an electron-transport layer, along with said light emissive material, in the organic optoelectronic device.

58. The method of claim 57 comprising embedding the metal exhibiting strong surface plasmon resonance in the transport layer as a periodic nanofabricated structure.

59. The method of claim 57 comprising embedding the metal exhibiting strong surface plasmon resonance in the transport layer as nanoparticles.

60. The method of claim 55 comprising encasing each nanoparticle in a shell material.

61. The method of claim 60 in which the shell material is selected from the group consisting of $SiO_2$, $TiO_2$, $Al_2O_3$, BaF, LiF, and $CaF_2$.

62. The method of claim 55 comprising encasing each nanoparticle in organic capping molecules.

63. The device of claim 29 in which the organic capping molecules are selected from the group consisting of polymers, alkylthiols, alkylamines, alkanes, surfactants, lipids, proteins, DNA, and alkylphosphates.

64. A method for fabricating an organic optoelectronic device, comprising:

providing a hole-injection layer, a hole-transport layer, an organic triplet light emitter material, and an electron-transport layer;

disposing the surface of a nanofabricated metal structure, exhibiting strong surface plasmon resonance in the visible range of the spectrum, in the vicinity of the light emitter material;

disposing a transparent dielectric spacer, having a thickness of between 2 and 400 nm, between the metal surface and the triplet emitter material to suppress non-radiative Förster-type energy transfer whereby to accelerate the emission rate of the emitter material; and disposing a transparent electrode and a second electrode on opposite sides of the light emitter material and metal whereby to apply an electrical potential across there to cause the light emitter material to emit light.

65. The device of claim 31 wherein the nanofabricated metal structure comprises a grating.

66. The device of claim 31 including embedding the nanofabricated metal structure, as nanoparticles encased in a shell material or in organic capping molecules, in the triplet emitting material.

* * * * *

UNITED STATES PATENT AND TRADEMARK OFFICE
CERTIFICATE OF CORRECTION

| | |
|---|---|
| PATENT NO. | : 6,999,222 B2 |
| APPLICATION NO. | : 10/639867 |
| DATED | : February 14, 2006 |
| INVENTOR(S) | : Guillermo C. Bazan et al. |

It is certified that error appears in the above-identified patent and that said Letters Patent is hereby corrected as shown below:

At column 1, line 3, before "Field of the Invention" add:

This invention was made with Government support under Grant No. DE-FC26-04NT42277 awarded by the Department of Energy. The Government has certain rights in the invention.

Signed and Sealed this

Twenty-sixth Day of May, 2009

JOHN DOLL
*Acting Director of the United States Patent and Trademark Office*